United States Patent
Wu et al.

(10) Patent No.: US 7,256,975 B2
(45) Date of Patent: Aug. 14, 2007

(54) ESD PROTECTION CIRCUIT AND METHOD

(75) Inventors: Yi-Hsun Wu, Shijr (TW); Jian-Hsing Lee, Pu-Tzu (TW); Shui-Hung Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 234 days.

(21) Appl. No.: 10/867,112

(22) Filed: Jun. 14, 2004

(65) Prior Publication Data

US 2005/0275987 A1  Dec. 15, 2005

(51) Int. Cl.
  *H02H 9/00* (2006.01)
(52) U.S. Cl. ........................................ 361/56
(58) Field of Classification Search ................ 361/56, 361/91.5, 91.1
  See application file for complete search history.

(56) References Cited

U.S. PATENT DOCUMENTS

| | | | |
|---|---|---|---|
| 6,327,126 B1* | 12/2001 | Miller et al. | 361/56 |
| 6,414,532 B1* | 7/2002 | Su et al. | 327/310 |
| 6,522,511 B1* | 2/2003 | John et al. | 361/56 |
| 6,538,868 B2* | 3/2003 | Chang et al. | 361/111 |
| 6,747,857 B1* | 6/2004 | Lee et al. | 361/56 |
| 6,867,957 B1* | 3/2005 | Tong et al. | 361/56 |
| 6,898,062 B2* | 5/2005 | Russ et al. | 361/56 |
| 2003/0076636 A1* | 4/2003 | Ker et al. | 361/56 |
| 2004/0110334 A1* | 6/2004 | Wu et al. | 438/200 |
| 2005/0041346 A1* | 2/2005 | Wu et al. | 361/56 |
| 2005/0264963 A1* | 12/2005 | Sato | 361/56 |

* cited by examiner

*Primary Examiner*—Michael Sherry
*Assistant Examiner*—Ann Hoang
(74) *Attorney, Agent, or Firm*—Thomas, Kayden, Horstemeyer & Risley

(57) ABSTRACT

An electrostatic discharge (ESD) protection circuit and method thereof are presented. In some embodiments, a high voltage tolerant input/output circuit comprises an ESD detection circuit, a first first-type transistor, a first second-type transistor, and a second second-type transistor. The first first-type transistor and the first second-type transistor are coupled to a pad. The ESD detection circuit determines whether ESD occurs at the pad and, if so, couples the gates of the first and second second-type transistors to the second power rail.

18 Claims, 3 Drawing Sheets

US 7,256,975 B2

ESD PROTECTION CIRCUIT AND METHOD

BACKGROUND OF THE INVENTION

1. Field of the Invention

The present invention relates in general to an ESD protection circuit and method thereof, and more specifically to a high voltage tolerant input/output circuit avoiding damage to N-type MOS transistors from electrostatic discharge (ESD).

2. Description of the Related Art

In the development of the semiconductor manufacture process, dimensions of complementary metal-oxide-semiconductor transistor (CMOS) have reached sub-micron level to upgrade the performance of very large scale integrated (VLSI) circuits and computational speed. As dimensions shrinks, reliability and ESD tolerance of VLSI circuits decline significantly.

ESD models include human-body model (HBM), machine model (MM), and charged-device model (CDM). All three generate instantaneous current of several amperes only for hundreds or even several nanoseconds.

FIG. 1 is a schematic diagram of a conventional high voltage tolerant CMOS VLSI input/output circuit. As shown in FIG. 1, the sources of the PMOS transistors P110-P1$n$ are coupled to the power rail Vcc1, gates of the PMOS transistors P110 and P111 are coupled to the power rail Vcc1, and gates of the PMOS transistors P112-P11$n$ are coupled to pre-driver P1. The drains of the NMOS transistors N110-N11$n$ and the corresponding drains of the PMOS transistors P110-P11$n$ are coupled to a pad 10, and all gates of the NMOS transistors N110-N11$n$ are coupled to the power rail Vcc1. The drains of the NMOS transistors N120-N12$n$ in another row are coupled to the corresponding sources of the NMOS transistors N110-N11$n$. According to the driving requirement, gates of the NMOS transistors N120 and N121 are connected to the power rail Vss1, and gates of the NMOS transistors N122-N12$n$ are coupled to pre-driver N1. The NMOS transistors N110-N11$n$ and the NMOS transistors N120-N12$n$ are connected in series, and the reliability of the NMOS transistors N120-N12$n$ is enhanced by voltage division. When ESD occurs at the pad 10, the discharge current follows the path of the PMOS transistors P110-P11$n$, the NMOS transistors N110-N11$n$, and the NMOS transistors N120-N12$n$. Because the bias conditions of each transistor differ, current discharge is not even, and some transistors damaged.

The NMOS transistor has an extremely thin gate oxide vulnerable to ESD damage. For example, at the output buffer stage, a commonly used NMOS transistor with a channel width of 300 submicrons can tolerate an ESD voltage of more than 3000 volts if fabricated by conventional 2-submicron manufacture process, and less than 2000 volts if by 1-submicron manufacture process with low-doping-drain (LDD) technology, and about 1000 volts if by 1-submicron manufacture process with LDD and silicide technology. Furthermore, ESD generates an instantaneous discharge current of several amperes in hundreds of nanoseconds. In the high voltage tolerant input/output circuit shown in FIG. 1, the ESD current follows a path of some components only, such that current discharge is uneven and slow, and some components are damaged.

SUMMARY OF THE INVENTION

Accordingly, the present invention provides an ESD protection circuit and method thereof. When ESD occurs, the discharge path is increased to evenly discharge the current and avoid damage to N-type MOS transistors.

One embodiment of the present invention provides an ESD protection circuit comprising an ESD detection circuit, a first first-type transistor, a first second-type transistor, and a second second-type transistor, wherein the drains of the first first-type and second-type transistors are coupled to a pad, the source of the first second-type transistor is coupled to the drain of the second second-type transistor, the source of the first first-type transistor is coupled to a first power rail, and the source of the second second-type transistor is coupled to a second power rail, and, in normal operation, the gate of the first second-type transistor is coupled to the first power rail and the gate of the second second-type transistor is controlled by a pre-driver. The ESD detection circuit determines whether ESD occurs at the pad and, if so, couples the gates of the first and second second-type transistors to the second power rail.

Another embodiment of the present invention provides a method for protecting devices from ESD, appropriate for a driver circuit wherein the driver circuit has a first first-type transistor, a first second-type transistor, and a second second-type transistor wherein the drains of the first first-type and second-type transistors are coupled to a pad, the source of the first second-type transistor is coupled to the drain of the second second-type transistor, the source of the first first-type transistor is coupled to a first power rail, and the source of the second second-type transistor is coupled to a second power rail. Some embodiments of the method comprise the steps of determining whether ESD occurs at the pad, and, when ESD occurs, coupling the gates of the first and second second-type transistors to the second power rail. When ESD does not occur, the gate of the first second-type transistor is coupled to the first power rail and the gate of the second second-type transistor is controlled by a pre-driver.

BRIEF DESCRIPTION OF THE DRAWINGS

The following detailed description, given by way of example and not intended to limit the invention solely to the embodiments described herein, is best understood in conjunction with the accompanying drawings, in which.

DETAILED DESCRIPTION OF THE INVENTION

Figure 1:
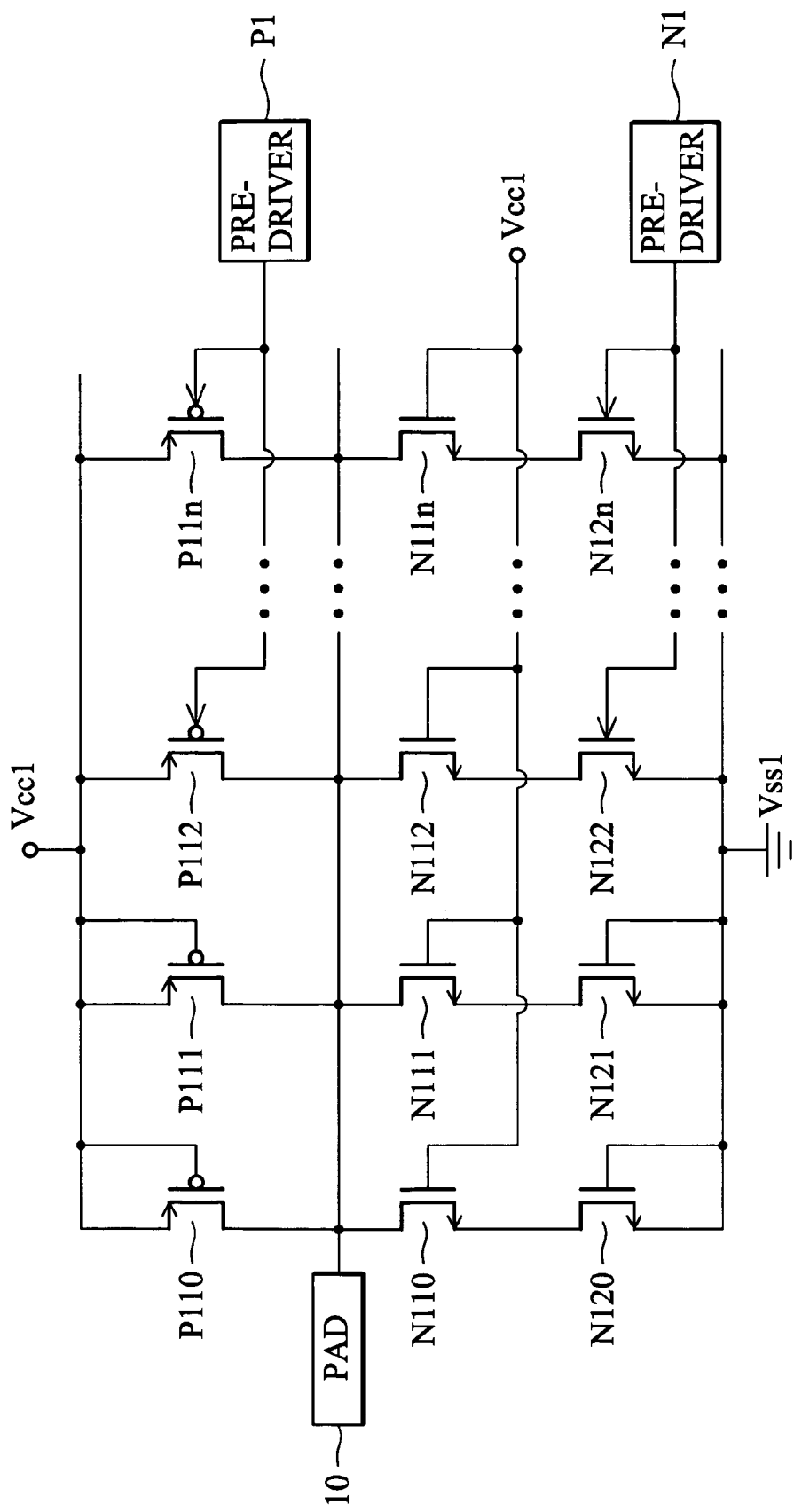
FIG. 1 is a schematic diagram of the high voltage tolerant CMOS VLSI input/output circuit according to the prior art.
Figure 2:
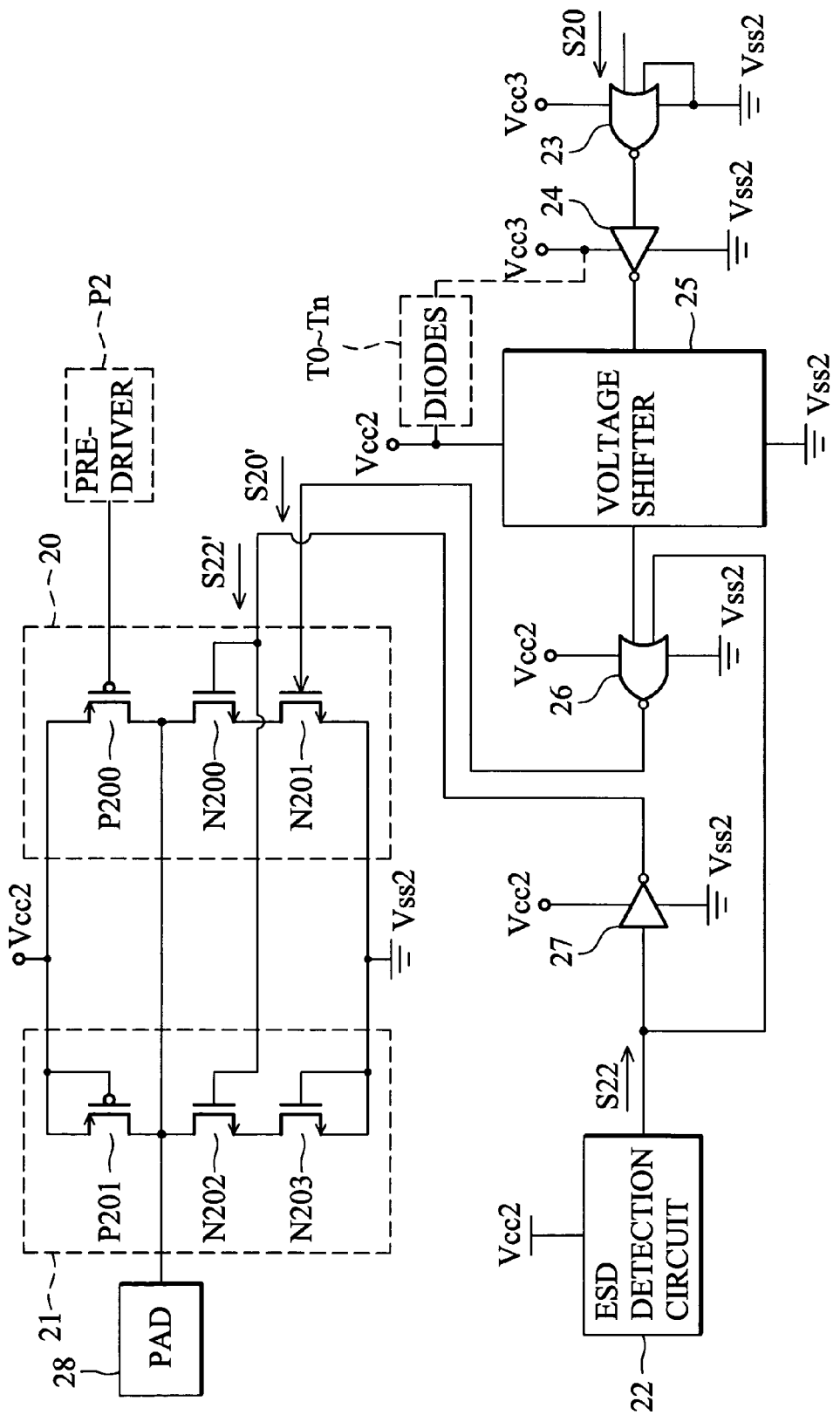
FIG. 2 is a block diagram of the high voltage tolerant CMOS VLSI input/output circuit according to an embodiment of the present invention.

FIG. 2 is a block diagram of the high voltage tolerant CMOS VLSI input/output circuit according to an embodiment of the present invention. The high voltage tolerant input/output circuit comprises a driver circuit 20, a redundant circuit 21, an ESD detection circuit 22, NOR gates 23 and 26, inverter circuits 24 and 27, a voltage shifter 25, a pad 28, and a pre-driver P2 wherein the transistors P200 and P201 are PMOS transistors and the transistors N200, N201, N202, and N203 are NMOS transistors.

When ESD occurs in the pad 28, the ESD detection circuit 22 outputs a signal S22 with a high logic level to the inverter circuit 27 and the NOR gate 26. The inverter circuit 27 outputs a signal S22' with a low logic level to gates of the NMOS transistors N200 and N202 after receiving S22. The voltage levels of S22' and the power rail Vss2 are equal, such that gates of the NMOS transistors N200 and N202 are coupled to the power rail Vss2. The NOR gate 26 outputs a signal S20' to the gate of the NMOS transistor N201 after receiving S22. The voltage levels of S20' and the power rail Vss2 are equal, such that the gate of the NMOS transistor N20 1 is coupled to the power rail Vss2.

In normal operation, the ESD detection circuit 22 outputs a signal S22 with a low logic level to the inverter circuit 27 and the NOR gate 26. The inverter circuit 27 outputs a signal S22' with a high logic level to gates of the NMOS transistors N200 and N202 after receiving S22. The voltage levels of S22' and the power rail Vcc2 are equal, such that gates of the NMOS transistors N200 and N202 are coupled to the power rail Vcc2. In normal operation, a signal S20 is input into the NOR gate 23, through the inverter circuit 24, the voltage shifter 25, and the NOR gate 26, and is output as a new signal S20' to the gate of the NMOS transistor N201. The logic levels of S20' and S20 are inverted, thus the gate of the NMOS transistor N201 is coupled to the power rail Vcc2 or the power rail Vss2. Moreover, in normal operation, the gate of the PMOS transistor P200 receives the signal from pre-driver P2.

Figure 3:
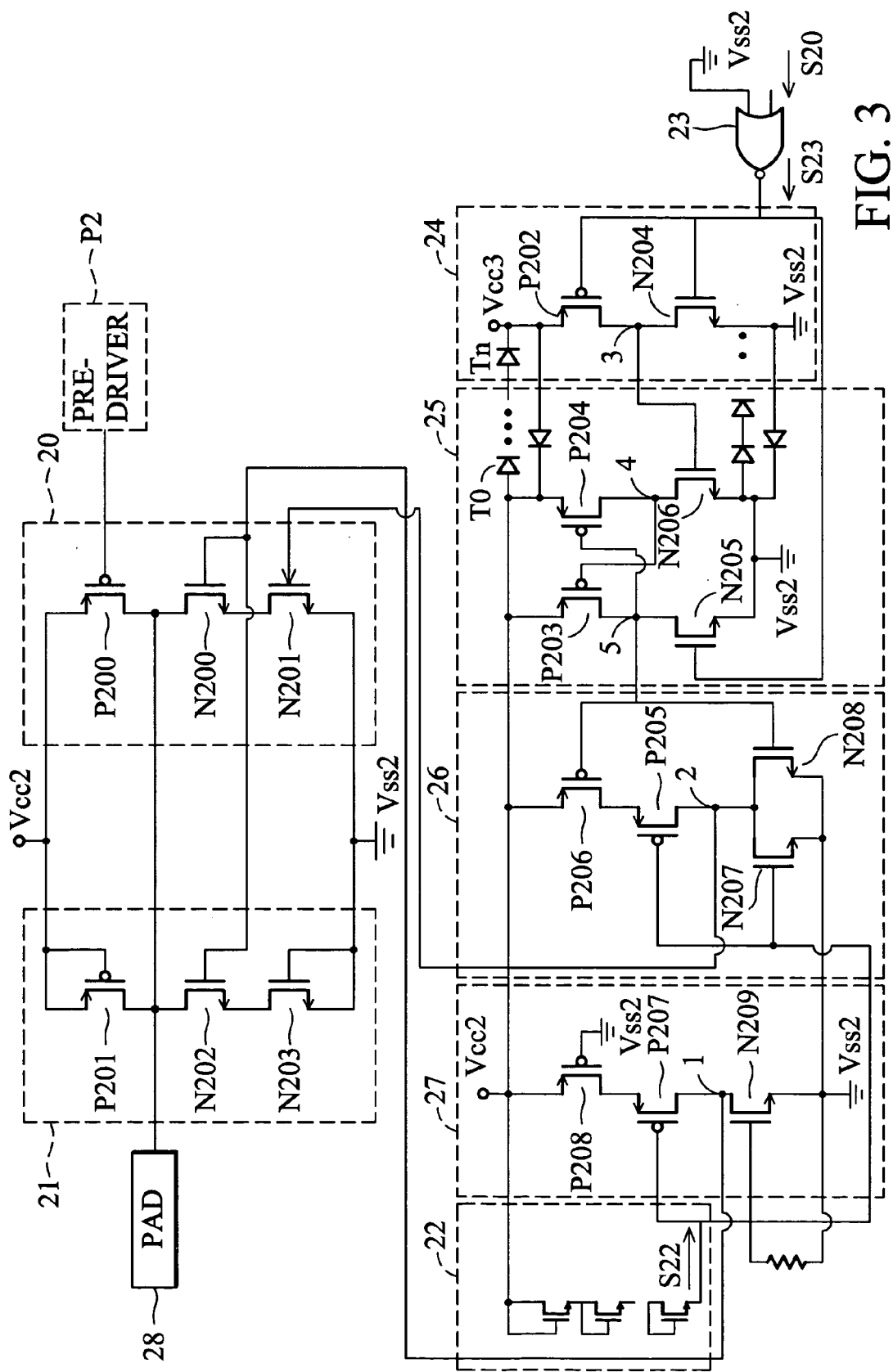
FIG. 3 is a schematic diagram of the high voltage tolerant CMOS VLSI input/output circuit according to another embodiment of the present invention.

FIG. 3 shows detailed circuits and descriptions of several components shown in FIG. 2.

The driver circuit 20 comprises a PMOS transistor P200 and NMOS transistors N200 and N201 wherein the drain of the PMOS transistor P200 and the drain of the NMOS transistor N200 are coupled to a pad 28, the source of the NMOS transistor N200 is coupled to the drain of the NMOS transistor N201, the source of the PMOS transistor P200 is coupled to a power rail Vcc2, as shown in FIG. 3. The source of the NMOS transistor N201 is coupled to a power rail Vss2.

The redundant circuit 21 comprises a PMOS transistor P201 and NMOS transistors N202 and N203, wherein the drain of the PMOS transistor P201 and the drain of the NMOS transistor N202 are coupled to the pad 28. The source of the NMOS transistor N202 is coupled to the drain of the NMOS transistor N203. The source of the PMOS transistor P201 is coupled to the high power rail Vcc2. The source and the gate of the NMOS transistor N203 are coupled to the low power rail Vss2.

The ESD detection circuit 22 is coupled to the power rail Vcc2, thereby detecting ESD at the pad 28 according to the voltage of the power rail Vcc2. The ESD detection circuit 22 comprises a plurality of NMOS transistors connected together in series wherein the drain and the gate of each NMOS transistor are coupled. The ESD detection circuit 22 couples gates of the NMOS transistors N200, N201, and N202 to the power rail Vss2 when ESD occurs at the pad 28.

The NOR gate 23 is controlled by the voltage of the power rail Vss2 and the received signal S20. The NOR gate 23 outputs a signal S23 at the output end wherein the logic levels of S23 and S20 are inverted.

The inverter circuit 24 comprises a PMOS transistor P202 and an NMOS transistor N204 wherein the gates of PMOS transistor P202 and NMOS transistor N204 are coupled to receive the signal S23. The source of the PMOS transistor P202 is coupled to a power rail Vcc3. The source of the NMOS transistor N204 is coupled to the power rail Vss2. The drains of the PMOS transistor P202 and the NMOS transistor N204 are coupled at a node 3.

The voltage shifter 25 is coupled to the inverter circuit 24 at node 3. The voltage shifter 25 comprises PMOS transistors P203 and P204 and NMOS transistors N205 and N206. The gate of the NMOS transistor N206 is coupled to node 3. The gate of the NMOS transistor N205 is coupled to the output end of the NOR gate 23 to receive the signal S23. The gate of the PMOS transistor P203, the drain of the PMOS transistor P204, and the drain of the NMOS transistor N206 are coupled at node 4. Both sources of the PMOS transistors P203 and P204 are coupled to the power rail Vcc2. Both sources of the NMOS transistors N205 and N206 are coupled to the power rail Vss2. The drain of the PMOS transistor P203, the gate of the PMOS transistor P204, and the drain of the NMOS transistor N205 are coupled at node 5. A plurality of diodes T0-Tn are connected in series between the voltage supplies Vcc2 and Vcc3, such that the voltage of the power rail Vcc3 is lower than that of the power rail Vcc2. If the PMOS transistor P202 is turned on and the NMOS transistor N204 is turned off, node 3 is coupled to the power rail Vcc3, thus the voltages of node 3 and the power rail Vcc3 are equal. The output end of the voltage shifter 25, node 5, is coupled to the power rail Vcc2. Thus, the voltages of node 5 and the power rail Vcc2 are equal.

The NOR gate 26 is coupled to the ESD detection circuit 22, to receive the signal S22, and to the voltage shifter 25 at node 5. In normal operation, the NOR gate 26 controls the gate of the NMOS transistor N201 according to the voltage level of node 5. When ESD occurs at the pad 28, the NOR gate 26 couples the gate of the NMOS transistor N201 to the power rail Vss2 according to the ESD detection circuit 22. The NOR gate 26 comprises PMOS transistors P205 and P206 and NMOS transistors N207 and N208. The gates of PMOS transistor P205 and NMOS transistor N207 are coupled to the ESD detection circuit 22. The gates of PMOS transistor P206 and NMOS transistor N208 are coupled to the voltage shifter 25 at node 5. The source of the PMOS transistor P205 is coupled to the drain of the PMOS transistor P206. The source of PMOS transistor P206 is coupled to the power rail Vcc2. The sources of the NMOS transistors N207 and N208 are coupled to the power rail Vss2. The drains of PMOS transistor P205, NMOS transistor N207, and NMOS transistor N208 are coupled to the gate of the NMOS transistor N201 at node 2.

The inverter circuit 27 is coupled to the ESD detection circuit 22 to receive the signal S22 and to couple the gates of the NMOS transistors N200 and N202 to the power rail Vss2 when ESD occurs at the pad 28. The inverter circuit 27 is composed of a NOR gate having two input ends. One end is coupled to the power rail Vss2, and the other end receives the signal S22. The NOR gate comprises PMOS transistors P207 and P208 and an NMOS transistor N209. The gates of PMOS transistor P207 and NMOS transistor N209 are coupled to receive the signal S22. The gate, the source, and the drain of the PMOS transistor P208 are coupled to the power rail Vss2, the power rail Vcc2, and the source of PMOS transistor P207, respectively. The drains of PMOS transistor P207 and NMOS transistor N209, and gates of NMOS transistor N200 and NMOS transistor N202, are all coupled at node 1.

When ESD occurs, the voltage of the pad 28 increases. Because of the PN junction current leakage of the PMOS transistor P201, the voltage level of the power rail Vcc2 also increases. When the voltage level of the power rail Vcc2 reaches a fixed value, the plurality of NMOS transistors in the ESD detection circuit 22 coupled to the power rail Vcc2 is turned on (here regarded as diodes due to connection type). With voltage division, the signal of the power rail Vcc2 goes through the plurality of NMOS transistors to output the signal S22 with a high logic level. Meanwhile, the signal S22 is input into the inverter circuit 27, such that the NMOS transistor N209 is turned on and the PMOS transistor P207 is turned off. Node 1 is coupled to the power rail Vss2. Thus, the voltages of node 1 and the power rail Vss2 are equal, and gates of the NMOS transistors N200 and N202 are coupled to the power rail Vss2. Also, the signal S22 is input into NOR gate 26. The signal S22, with a high logic level, turns on the NMOS transistor N207 and turns off the PMOS transistor P205, such that node 2 is coupled to the power rail Vss2. Thus, the voltages of node 2 and the power rail Vss2 are equal. Moreover, the gate of the NMOS transistor N201 is coupled to the power rail Vss2.

In normal operation, the power rail Vcc2 is at a high voltage level and the power rail Vss2 is at a low voltage level. The voltage of the power rail Vcc2 turns on the plurality of NMOS transistors in the ESD detection circuit 22 coupled to the power rail Vcc2 (here regarded as diodes due to connection type). With voltage division, the signal of the power rail Vcc2 goes through the plurality of NMOS transistors to output the signal S22 with a low logic level. The logic level of the signal S22 can be adjusted by controlling the number of NMOS transistors inside the ESD detection circuit 22. The voltage levels of Vcc2 differ in normal operation and when ESD occurs, such that the logic level of the signal S22 is low during normal operation and high during ESD.

The signal S22 is input into the inverter circuit 27 to turn off the NMOS transistor N209 and turn on the PMOS transistor P207. Thus, node 1 is coupled to the power rail Vcc2, and the voltages of node 1 and the power rail Vcc2 are equal. Moreover, gates of the NMOS transistors N200 and N202 are coupled to the power rail Vcc2.

Furthermore, in normal operation, if the NOR gate 23 receives signal S20 with a high logic level, then the NOR gate 23 outputs the signal S23 with a low logic level. The inverter circuit 24 receives the signal S23 to turn on the PMOS transistor P202 and to couple node 3 to the power rail Vcc3 with a high voltage level. Consequently, the voltage level of Vcc3 is lower than the voltage level of Vcc2. Because the gate of the NMOS transistor N206 of the voltage shifter 25 is coupled to node 3, NMOS transistor N206 is turned on and node 4 is coupled to the power rail Vss2, and the PMOS transistor P203 is turned on and node 5 is coupled to the power rail Vcc2. Furthermore, the NOR gate 26 receives the signal S22 with a low logic level to turn off the NMOS transistor N207 and turn on the PMOS transistor P205. Because the gate of the PMOS transistor P206 and the gate of the NMOS transistor N208 are coupled to node 5, the PMOS transistor P206 is turned off and the NMOS transistor N208 is turned on. Thus, node 2 is coupled to the power rail Vss2, and the voltages of node 2 and the power rail Vss2 are equal. Moreover, the gate of the NMOS transistor N201 is coupled to the power rail Vss2.

Similarly, in normal operation, if the NOR gate 23 receives the signal S20 with a low logic level, then the NOR gate 23 outputs the signal S23 with a high logic level. The inverter circuit 24 receives the signal S23 to turn on the NMOS transistor N204 and to couple node 3 to the power rail Vss2. Because the gate of the NMOS transistor N206 of the voltage shifter 25 is coupled to node 3, the NMOS transistor N206 is turned off. The gate of the NMOS transistor N205 receives the signal S23 with a high logic level to turn on the NMOS transistor N205 and to couple node 5 to the power rail Vss2. Furthermore, the NOR gate 26 receives the signal S22 with a low logic level to turn off the NMOS transistor N207 and turn on the PMOS transistor P205. Because the gate of the PMOS transistor P206 and the gate of the NMOS transistor N208 are coupled to node 5, the PMOS transistor P206 is turned on and the NMOS transistor N208 is turned off. Thus, node 2 is coupled to the power rail Vcc2, and the voltages of node 2 and the power rail Vcc2 are equal. Moreover, the gate of the NMOS transistor N201 is coupled to the power rail Vcc2.

In conclusion, in normal operation, gates of the NMOS transistors N200 and N202 are coupled to the power rail Vcc2, and the gate of the NMOS transistor N201 is coupled to the power rail Vcc2 or the power rail Vss2 according to the signal S20. The PMOS transistor P200 is controlled by pre-driver P2 and outputs signals at the pad 28 to a back end. When ESD occurs, gates of the NMOS transistors N201, N200, and N202 are coupled to the power rail Vss2, such that the bias conditions of the NMOS transistors N200, N201, N202, and N203 are the same. Thus the NMOS transistors can be turned on at the same time to discharge the ESD current, thereby increasing the discharge path to avoid potential damage to transistors.

While embodiments of the invention have been described by way of example and in terms of the preferred embodiment, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electrostatic discharge (ESD) protection circuit, comprising:
   a first first-type transistor;
   a first second-type transistor;
   a second second-type transistor, wherein the drains of the first first-type and second-type transistors are coupled to a pad, wherein the source of the first second-type transistor is coupled to the drain of the second second-type transistor, wherein the source of the first first-type transistor is coupled to a first power rail, and the source of the second second-type transistor is coupled to a second power rail, and wherein, during normal operation, the gate of the first second-type transistor is coupled to the first power rail, and the gate of the second second-type transistor is controlled by a pre-driver;
   an ESD detection circuit configured to detect whether ESD occurs at the pad, the ESD detection circuit being further configured to equalize voltage levels of the gates of the first and second second-type transistors and the second power rail during ESD;
   a redundant circuit having a second first-type transistor, a third second-type transistor, and a fourth second-type transistor, wherein the drain of the second first-type transistor and the drain of the third second-type transistor are coupled to the pad, wherein the source of the third second-type transistor is coupled to the drain of the fourth second-type transistor, wherein the source of the second first-type transistor is coupled to the first power rail, wherein the source and the gate of the fourth second-type transistor are coupled to the second power rail, and wherein, during normal operation, the gate of the third second-type transistor is coupled to the first power rail; and
   an inverter circuit coupled to the ESD detection circuit, the inverter circuit configured to couple the gate of the first second-type transistor and the gate of the third second-type transistor to the second power rail.

2. The ESD protection circuit as claimed in claim 1, wherein the inverter circuit is composed of a NOR gate having two input ends, wherein one input end is coupled to the second power rail, and wherein the other input end is controlled by the ESD detection circuit.

3. The ESD protection circuit as claimed in claim 2, wherein the NOR gate comprises:
a third first-type transistor;
a fourth first-type transistor; and
a fifth second-type transistor, wherein the gate of the third first-type transistor and the gate of the fifth second-type transistor are coupled to the output end of the ESD detection circuit, wherein the gate, the source, and the drain of the fourth first-type transistor are coupled to the second power rail, the first power rail, and the source of the third first-type transistor, respectively, and wherein the drain of the third first-type transistor, the drain of the fifth second-type transistor, the gate of the first second-type transistor, and the gate of the third second-type transistor are coupled together.

4. The ESD protection circuit as claimed in claim 1, wherein the pre-driver comprises:
a voltage shifter configured to receive a first signal, convert the voltage level of the first signal, and output a voltage conversion signal; and
a NOR gate controlled by the ESD detection circuit and the voltage shifter, wherein, during normal operation, the NOR gate controls the gate of the second second-type transistor according to the voltage conversion signal, and wherein, during ESD at the pad, the NOR gate is configured to couple the gate of the second second-type transistor to the second power rail according to the ESD detection circuit.

5. The ESD protection circuit as claimed in claim 4, wherein the voltage shifter comprises:
a fifth first-type transistor;
a sixth first-type transistor;
a sixth second-type transistor; and
a seventh second-type transistor, wherein the gate of the sixth second-type transistor and the gate of the seventh second-type transistor are configured to receive the first signal, wherein the gate of the fifth first-type transistor, the drain of the sixth first-type transistor, and the drain of the seventh second-type transistor are coupled together, wherein the sources of the fifth first-type transistor and the sixth first-type transistor are coupled to the first power rail, wherein the sources of the sixth second-type transistor and the seventh second-type transistor are coupled to the second power rail, and wherein the drain of the fifth first-type transistor, the gate of the sixth first-type transistor, and the drain of the sixth second-type transistor are coupled to output the voltage conversion signal.

6. The ESD protection circuit as claimed in claim 4, wherein the NOR gate comprises:
a seventh first-type transistor;
an eighth first-type transistor;
an eighth second-type transistor; and
a ninth second-type transistor, wherein the gate of the seventh first-type transistor and the gate of the eighth second-type transistor are coupled to the ESD detection circuit, wherein the gate of the eighth first-type transistor and the gate of the ninth second-type transistor are coupled to the voltage shifter, wherein the source of the seventh first-type transistor is coupled to the drain of the eighth first-type transistor, wherein the source of the eighth first-type transistor is coupled to the first power rail, wherein the source of the eighth second-type transistor and the source of the ninth second-type transistor are coupled to the second power rail, and wherein the drain of the seventh first-type transistor, the drain of the eighth second-type transistor, and the drain of the ninth second-type transistor are coupled to the gate of the second second-type transistor.

7. The ESD protection circuit as claimed in claim 1, wherein the ESD detection circuit is coupled to the first power rail, wherein the ESD detection circuit is configured to detect whether ESD occurs at the pad according to the voltage of the first power rail, wherein the ESD detection circuit further comprises a plurality of second-type transistors connected together in series, and wherein the drain and the gate of each transistor of the plurality of second-type transistors are coupled together.

8. The ESD protection circuit as claimed in claim 1, wherein the first-type transistor is a P-type transistor and the second-type transistor is an N-type transistor.

9. An electrostatic discharge (ESD) protection circuit, comprising:
a first first-type transistor;
a first second-type transistor;
a second second-type transistor, wherein the drains of the first first-type and second-type transistors are coupled to a pad, wherein the source of the first second-type transistor is coupled to the drain of the second second-type transistor, wherein the source of the first first-type transistor is coupled to a first power rail, and wherein the source of the second second-type transistor is coupled to a second power rail;
an ESD detection circuit configured to detect whether ESD occurs at the pad;
a first NOR gate controlled by the second power rail and a first signal, the first NOR gate configured to output a second signal at an output end thereof, wherein the logic levels of the second signal and the first signal are inverted;
a first inverter circuit coupled to the first NOR gate, the first inverter circuit configured to receive the second signal and output a third signal, wherein the logic levels of the third signal and the second signal are inverted;
a voltage shifter configured to receive the third signal, convert the voltage level of the third signal, and output a voltage conversion signal;
a second NOR gate controlled by the ESD detection circuit and the voltage shifter, wherein, during normal operation, the second NOR gate controls the gate of the second second-type transistor according to the voltage conversion signal, and wherein, during ESD at the pad, the second NOR gate couples the gate of the second second-type transistor to the second power rail according to the ESD detection circuit; and
a second inverter circuit coupled to the ESD detection circuit, the second inverter circuit configured to couple the gate of the first second-type transistor to the second power rail.

10. The ESD protection circuit as claimed in claim 9, further comprising a redundant circuit having:
a second first-type transistor;
a third second-type transistor; and
a fourth second-type transistor, wherein the drain of the second first-type transistor and the drain of the third second-type transistor are coupled to the pad, wherein the source of the third second-type transistor is coupled to the drain of the fourth second-type transistor, wherein the source of the second first-type transistor is coupled to the first power rail, wherein the source and the gate of the fourth second-type transistor are coupled to the second power rail, wherein, during normal operation, the gate of the third second-type transistor is coupled to the first power rail, and wherein, during ESD at the pad, the second inverter circuit couples the gate of the third second-type transistor to the second power rail.

11. The ESD protection circuit as claimed in claim 9, wherein the ESD detection circuit is coupled to the first power rail, wherein the ESD detection circuit is configured to detect whether ESD occurs at the pad according to the voltage of the first power rail, wherein the ESD detection circuit comprises a plurality of second-type transistors connected together in series, and wherein the drain and the gate of each transistor of the plurality of second-type transistors are coupled together.

12. The ESD protection circuit as claimed in claim 9, wherein the first inverter circuit comprises:
  a third first-type transistor; and
  a fifth second-type transistor, wherein the gate of the third first-type transistor and the gate of the fifth second-type transistor are coupled to receive the second signal, wherein the source of the third first-type transistor is coupled to a third power rail, wherein the source of the fifth second-type transistor is coupled to the second power rail, and wherein the drain of the third first-type transistor and the drain of the fifth second-type transistor are coupled to output the third signal.

13. The ESD protection circuit as claimed in claim 9, wherein the voltage shifter comprises:
  a fourth first-type transistor;
  a fifth first-type transistor;
  a sixth second-type transistor; and
  a seventh second-type transistor, wherein the gate of the seventh second-type transistor receives the third signal and the gate of the sixth second-type transistor receives the second signal, wherein the gate of the fourth first-type transistor, the drain of the fifth first-type transistor, and the drain of the seventh second-type transistor are coupled together, wherein the sources of the fourth first-type transistor and the fifth first-type transistor are coupled to the first power rail, wherein the sources of the sixth second-type transistor and the seventh second-type transistor are coupled to the second power rail, and wherein the drain of the fourth first-type transistor, the gate of the fifth first-type transistor, and the drain of the sixth second-type transistor are coupled to output the voltage conversion signal.

14. The ESD protection circuit as claimed in claim 9, wherein the second NOR gate comprises:
  a sixth first-type transistor;
  a seventh first-type transistor;
  an eighth second-type transistor; and
  a ninth second-type transistor, wherein the gate of the sixth first-type transistor and the gate of the eighth second-type transistor are coupled to the ESD detection circuit, wherein the gate of the seventh first-type transistor and the gate of the ninth second-type transistor are coupled to the voltage shifter, wherein the source of the sixth first-type transistor is coupled to the drain of the seventh first-type transistor, wherein the source of the seventh first-type transistor is coupled to the first power rail, wherein the source of the eighth second-type transistor and the source of the ninth second-type transistor are coupled to the second power rail, and wherein the drain of the sixth first-type transistor, the drain of the eighth second-type transistor, and the drain of the ninth second-type transistor are coupled to the gate of the second second-type transistor.

15. The ESD protection circuit as claimed in claim 9, wherein the second inverter circuit comprises a third NOR gate having two input ends, wherein one of the two input ends is coupled to the second power rail, and wherein the other of the two input ends is controlled by the ESD detection circuit.

16. The ESD protection circuit as claimed in claim 15, wherein the third NOR gate comprises:
  an eighth first-type transistor;
  a ninth first-type transistor; and
  a tenth second-type transistor, wherein the gate of the eighth first-type transistor and the gate of the tenth second-type transistor are coupled to the output end of the ESD detection circuit, wherein the gate, the source, and the drain of the ninth first-type transistor are coupled to the second power rail, the first power rail, and the source of the eighth first-type transistor, respectively, and wherein the drain of the eighth first-type transistor, the drain of the tenth second-type transistor, the gate of the first second-type transistor, and the gate of the third second-type transistor are coupled together.

17. The ESD protection circuit as claimed in claim 12, wherein the voltage of the first power rail exceeds that of the third power rail.

18. The ESD protection circuit as claimed in claim 9, wherein the first-type transistor is a P-type transistor and the second-type transistor is an N-type transistor.

* * * * *